United States Patent
Park et al.

(10) Patent No.: US 9,799,706 B2
(45) Date of Patent: Oct. 24, 2017

(54) RESISTIVE RANDOM ACCESS MEMORY DEVICE EMBEDDING TUNNEL INSULATING LAYER AND MEMORY ARRAY USING THE SAME AND FABRICATION METHOD THEREOF

(71) Applicants: Seoul National University R&DB FOUNDATION, Seoul (KR); Gachon University of Industry-Academic cooperation Foundation, Seongnam-si, Gyeonggi-do (KR)

(72) Inventors: Byung-Gook Park, Seoul (KR); Seongjae Cho, Seoul (KR); Sungjun Kim, Seoul (KR)

(73) Assignees: Seoul National University R&DB Foundation, Seoul (KR); Gachon University of Industry-Academic Cooperation Foundation, Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 15/182,640

(22) Filed: Jun. 15, 2016

(65) Prior Publication Data
US 2017/0025605 A1    Jan. 26, 2017

(30) Foreign Application Priority Data
Jul. 20, 2015  (KR) .................. 10-2015-0102690

(51) Int. Cl.
*H01L 45/00* (2006.01)
*H01L 27/24* (2006.01)
*G11C 13/00* (2006.01)

(52) U.S. Cl.
CPC ........ *H01L 27/2463* (2013.01); *G11C 13/004* (2013.01); *G11C 13/0007* (2013.01);
(Continued)

(58) Field of Classification Search
CPC ............... H01L 45/1246; H01L 45/085; H01L 45/1233; H01L 45/1266; H01L 45/146; H01L 45/1616; H01L 27/2463
See application file for complete search history.

(56) References Cited

U.S. PATENT DOCUMENTS 7,151,300 B2 * 12/2006 Chang ................. H01L 45/1226
  257/2
8,268,713 B2 *  9/2012 Yamagishi ............ H01L 27/228
  257/E21.643
(Continued)

FOREIGN PATENT DOCUMENTS

JP    2008205191 A  * 9/2008 .......... H01L 29/685
KR    10-1257365        4/2013

*Primary Examiner* — Ida M Soward
(74) *Attorney, Agent, or Firm* — Gerald E. Hespos; Michael J. Porco; Matthew T. Hespos

(57) ABSTRACT

A resistive random access memory device is provided with a tunneling insulator layer between a resistance change layer and a bottom electrode. Thus, it is possible: to raise the selection (on/off) ratio by the current of a direct tunneling induced by low voltage in the unselected cell and the current of an F-N tunneling induced by high voltage in the selected cell, to efficiently suppress the leakage current in the read operation, to make a low current operation less μA level by controlling the thickness of the tunneling insulator layer, and to be simultaneously fabricated together with circuit devices by forming the bottom electrodes (word lines) with a semiconductor material.

20 Claims, 7 Drawing Sheets

(52) U.S. Cl.
CPC ...... *H01L 27/2409* (2013.01); *H01L 27/2472* (2013.01); *H01L 45/10* (2013.01); *H01L 45/1233* (2013.01); *H01L 45/145* (2013.01); *H01L 45/147* (2013.01); *H01L 45/148* (2013.01); *H01L 45/149* (2013.01); *H01L 45/1616* (2013.01); *G11C 2013/005* (2013.01); *G11C 2213/15* (2013.01); *G11C 2213/33* (2013.01); *G11C 2213/54* (2013.01)

(56) References Cited

U.S. PATENT DOCUMENTS

| | | | | |
|---|---|---|---|---|
| 8,742,507 | B2* | 6/2014 | Tamai | H01L 45/08 257/364 |
| 8,853,663 | B2* | 10/2014 | Sumino | G11C 13/0002 257/1 |
| 8,969,843 | B2* | 3/2015 | Ohba | H01L 45/12 257/2 |
| 2012/0091415 | A1* | 4/2012 | Sumino | H01L 43/08 257/2 |
| 2013/0193396 | A1* | 8/2013 | Nakano | H01L 45/145 257/4 |

* cited by examiner

RESISTIVE RANDOM ACCESS MEMORY DEVICE EMBEDDING TUNNEL INSULATING LAYER AND MEMORY ARRAY USING THE SAME AND FABRICATION METHOD THEREOF

CROSS-REFERENCE TO RELATED APPLICATION

This application claims priority to Korean Patent Application No. 10-2015-0102690, filed on Jul. 20, 2015, under 35 U.S.C. 119, the entire contents of which are hereby incorporated by reference.

BACKGROUND

1. Field of the Invention

The present invention relates to a resistive switching memory, i.e., a resistive random access memory (RRAM) device, and more particularly to a resistive random access memory device embedding a tunnel insulating layer and a memory array using the same and fabrication method thereof.

2. Description of the Related Art

Today, NAND flash memory technology leads the markets of mass storage devices by scaling down continuously. However, since the size of device is scaled down below 20 nm, some reliability problems are recently coming out. Thus, various next generation non-volatile memories have been suggested and studied actively for replacing the NAND flash memory technology.

Among them, RRAM having a simple structure is advantageous for scaling down and basically has a material composition of MIM (metal-insulator-metal) as shown in FIG. 1. The switching operation of RRAM is divided into 3 steps. As shown in FIG. 2, it is consisted of a forming process that forms conductive filaments in an initial state to be a low resistance state, a reset operation that cuts off the conductive filaments to increase the resistance and a set operation that reproduce the conductive filaments to decrease the resistance. The forming process is an initial operation of the set operation and needs higher voltage than the others.

In the conventional structure of RRAM, because the interface between a metal and an insulator is plane, when voltages are applied to both ends, the electric field is uniformly distributed. So, in the MIM structure, because the conductive filaments produced during the forming and set operations are formed at random places, it is difficult to precisely control and shows a high reset current. Especially, a unipolar RRAM that operates as shown in FIG. 3(A) is disadvantageous in commercialization due to uneven switching parameter distribution and high reset current. Thus, recently, a bipolar RRAM that operates as shown in FIG. 3(B) is more interested.

In a memory array using RRAM, there is an array method, as shown in FIG. 4, that top and bottom electrodes are vertically crossed to each other to use as word and bit lines, respectively. For reading data, a V/2 method is used. Namely, as shown in FIG. 4, when a cell 300 is selected to be read, V and 0 voltages are applied to a bit line 200 as a top electrode and a word line 100 as a bottom electrode, respectively. And 1/2 V is applied to the other lines for applying only 1/2 V between the top and bottom electrodes of cells 410, 420, 430 and 440 commonly connected to each of the lines 100 and 200 of the cell 300 selected to be read. However, when the cell 300 selected to be read is FIRS (high resistance state), because not only a current (as a solid line shown in FIG. 4) of the selected cell, but also leakage currents (as broken lines shown in FIG. 4) of the adjacent cells 430 and 440 are sensed together, the leakage currents of the adjacent cells 430 and 440 are to be causes of an error in a reading operation and a restriction in an array size.

To overcome the leakage current problems of the adjacent cells, as shown in FIG. 5, it is operated as the V/2 method after changing the electrical property of a memory device by connecting each bipolar RRAM cell with a bipolar selector. Accordingly, because an additional process is needed to form the additional bipolar selectors, the complexity of the fabricating process is increased and the thickness of the entire device is thickly increased. So, there is a disadvantage in forming a high integration.

To overcome the above disadvantage, Korean Patent No. 10-1257365 discloses an attempt to simultaneously form a resistance change layer and a threshold switching layer for substituting a switching device. According the above patent, the bottom electrode is formed of platinum (Pt), the top electrode is formed of transition metal such as tungsten (W), a phase-change layer between the electrodes is formed of transition metal oxide such as niobium oxide ($Nb_2O_{6-x}$), vanadium oxide ($V_2O_{6-x}$) or Ti, Fe, Ni, etc. When oxygen ions within the phase-change layer are moved to the top electrode by applying a voltage to both electrodes, from the bottom electrode, the phase-change layer is materially changed into a state with oxygen vacancies to grow and form the threshold switching layer having a conductive property induced by heat energy in case of applying a higher voltage than the predetermined voltage and, in the top electrode, the resistance change layer is formed by oxidation reaction. Thus, it has techanical features simultaneously forming two layers having different characteristics each other by a single forming process.

However, because the Patent No. 10-1257365 also discloses the conventional MIM structure that is consisted of the bottom electrode formed of platinum (Pt), the top electrode formed of transition metal such as tungsten (W), the transition metal oxide filled between the electrodes and the threshold switching and resistance change layers formed by removing oxygen ions induced by applying a voltage to both electrodes, it is difficult to embody a three dimensional vertical array and also it needs an additional fabricating process separated from the process for adjacent circuit devices of the array. Namely, it is not compatible to the conventional silicon process.

SUMMARY

The objective of the present invention is to provide a resistive random access memory device, a memory array using the same and a fabrication method thereof, which embed a tunneling insulator layer between a resistance change layer and a bottom electrode to overcome limits of performance and array integration density in the conventional RRAM. Thus, it is possible to make a low current operation, efficiently suppress the leakage current in the read operation by raising the switching ratio and obtain silicon compatibility.

To achieve the objective, a resistive random access memory device according to the present invention comprises: a bottom electrode formed of a semiconductor material implanted with impurity ions; a tunneling insulator layer formed on the bottom electrode; a resistance change layer formed on the tunneling insulator layer; and a top electrode formed on the resistance change layer.

The resistance change layer may be formed of a high dielectric (high-k) material having a higher dielectric constant than silicon oxide ($SiO_2$) film, and the tunneling insulator layer may be formed of a silicon oxide film or a low dielectric (low-k) material having a lower dielectric constant than the silicon oxide film and have a thin thickness less than that of the resistance change layer.

The semiconductor material may be silicon and the resistance change layer may be formed of material having traps.

The bottom electrode may be implanted p-type impurity ions, the tunneling insulator layer may be formed of one of $SiO_2$, carbon-doped silicon dioxide, porous silicon dioxide and HSQ and the resistance change layer may be formed of one or more of nitride, $Pr_{1-x}Ca_xMnO_3(0 \leq x \leq 1)$, $SrTiO_3$, amorphous silicon and carbon.

The nitride may be $Si_3N_4$ and the tunneling insulator layer may have a thickness of 2~3 nm.

A memory array according to the present invention comprises: a semiconductor substrate; a plurality of word lines formed in the semiconductor substrate in a first direction, a separating insulator film being located between the word lines; a tunneling insulator layer formed on the plurality of word lines; a resistance change layer formed on the tunneling insulator layer; and a plurality of bit lines formed on the resistance change layer in a second direction across the word lines.

Metal contact plugs may be further formed between the resistance changer layer and the bit lines at places where the word lines are across the bit lines.

The resistance change layer may be formed of a high dielectric (high-k) material having a higher dielectric constant than silicon oxide ($SiO_2$) film and the tunneling insulator layer may be formed of a silicon oxide film or a low dielectric (low-k) material having a lower dielectric constant than the silicon oxide film and have a thin thickness less than that of the resistance change layer.

The word lines may be implanted p-type impurity ions, the tunneling insulator layer may be formed of one of $SiO_2$, carbon-doped silicon dioxide, porous silicon dioxide and HSQ and the resistance change layer may be formed of one or more of nitride, $Pr_{1-x}Ca_xMnO_3(0 \leq x \leq 1)$, $SrTiO_3$, amorphous silicon and carbon.

The nitride may be $Si_3N_4$ and the tunneling insulator layer may have a thickness of 2~3 nm.

A method for fabricating a memory array according to the present invention comprises: a first step of forming a plurality of word lines in a semiconductor substrate by forming separating insulator films and having an ion implantation; a second step of forming a tunneling insulator layer on the plurality of word lines by a deposition or oxidation process; a third step of forming a resistance change layer by a chemical vapor deposition (CVD) process; and a fourth step of forming a plurality of bit lines on the resistance change layer in a direction across the word lines.

The semiconductor substrate may be a silicon substrate and the first step may further include steps of forming and removing a buffer layer formed of silicon oxide film before and after forming the separating insulator films and having the ion implantation, respectively.

After the ion implantation, the separating insulator film may be formed by high temperature oxidation and annealing process after exposing the silicon substrate by partially removing the buffer layer at a region to form the separating insulator film.

The tunneling insulator layer of the second step may be formed of silicon oxide film by a low temperature oxidation process and the resistance change layer of the third step may be continuously formed of silicon nitride ($Si_3N_4$) film by low pressure chemical vapor deposition (LPCVD) after forming the tunneling insulator layer.

The present invention can raise the selection (on/off) ratio by the current of a direct tunneling induced by low voltage in the unselected cell and the current of the F-N tunneling induced by high voltage in the selected cell, efficiently suppress the leakage current in the read operation, make a low current operation less μA level by controlling the thickness of the tunneling insulator layer, and simultaneously fabricated together with circuit devices by forming the bottom electrodes (word lines) with a semiconductor material.

BRIEF DESCRIPTION OF THE DRAWINGS

FIG. 3 is an electrical characteristic diagram showing operation modes of a resistive random access memory device.

FIG. 10(A) shows a leakage current generated by a direct tunneling when a low voltage ($V_{READ}/2$) is applied to an unselected cell and FIG. 10(B) shows an operation current generated by an F-N tunneling when a high voltage ($V_{READ}$) is applied to a selected cell.

FIG. 12(A) is a log scale and FIG. 12(B) is a linear scale showing curve 3 according to an embodiment of the present invention together with curve 1 of a single layer.

In these drawings, the following reference numbers are used throughout: reference number 1 indicates a semiconductor substrate, 2 a separating insulator film, 10 a bottom electrode or a word line, 20 a tunneling insulator layer, 22 a leakage current, 24 an operation current, 30 a resistance change layer, 32 a conducting path and 40 a tope electrodes or a metal contact plug.

DETAILED DESCRIPTION

Detailed descriptions of preferred embodiments of the present invention are provided below with reference to accompanying drawings.

Figure 1:
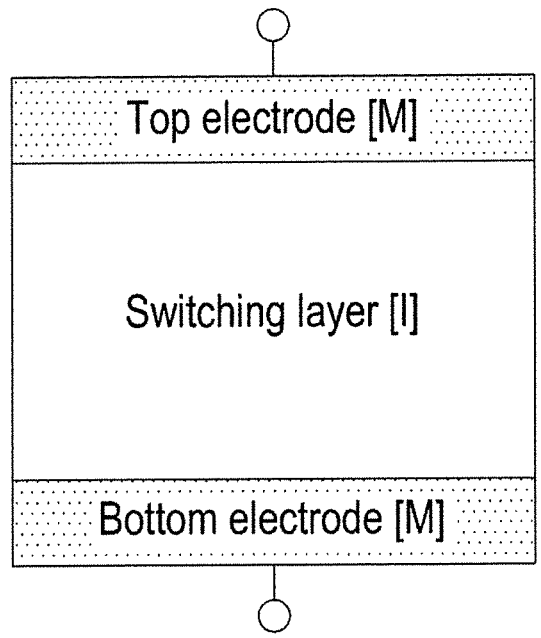
FIG. 1 is a cross sectional view showing a basic structure of the conventional resistive random access memory device.
Figure 2:
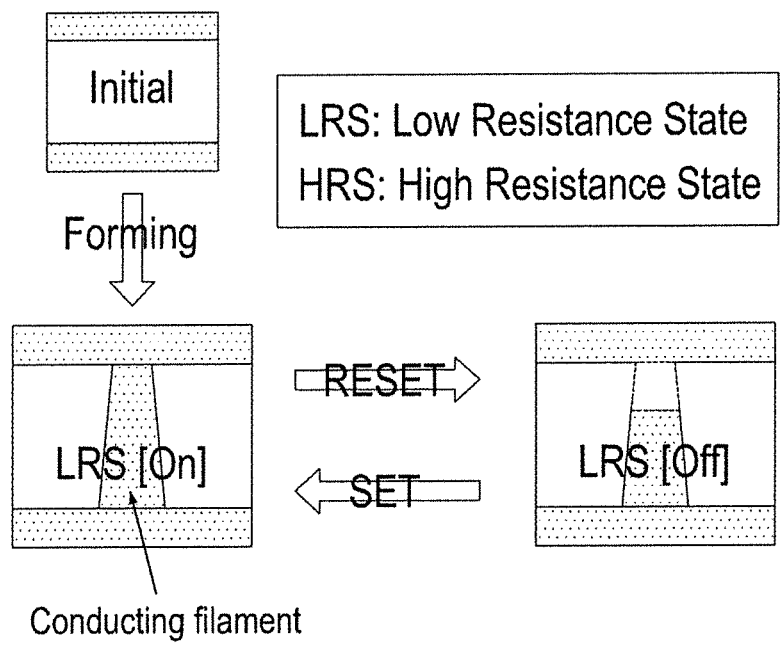
FIG. 2 is a concept diagram showing the switching operation characteristics of the conventional resistive random access memory device having a structure shown in FIG. 1.
Figure 3A:
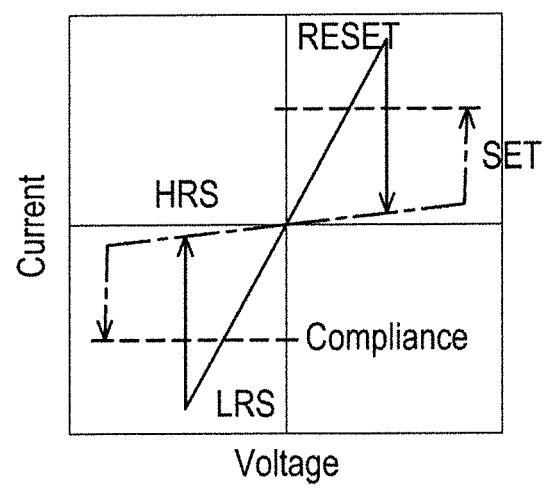
FIG. 3(A) is a unipolar mode and FIG. 3(B) is a bipolar mode.
Figure 3B:
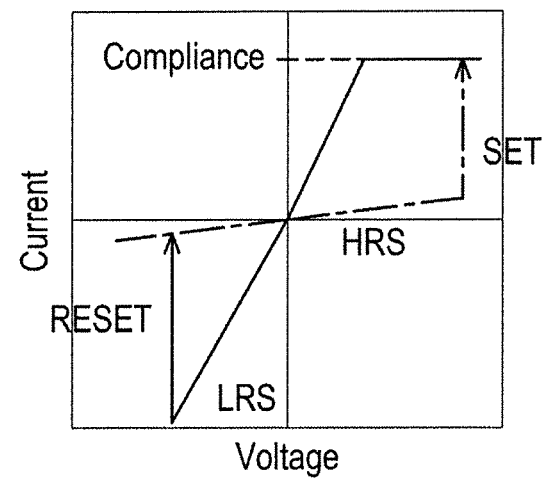
Figure 4:
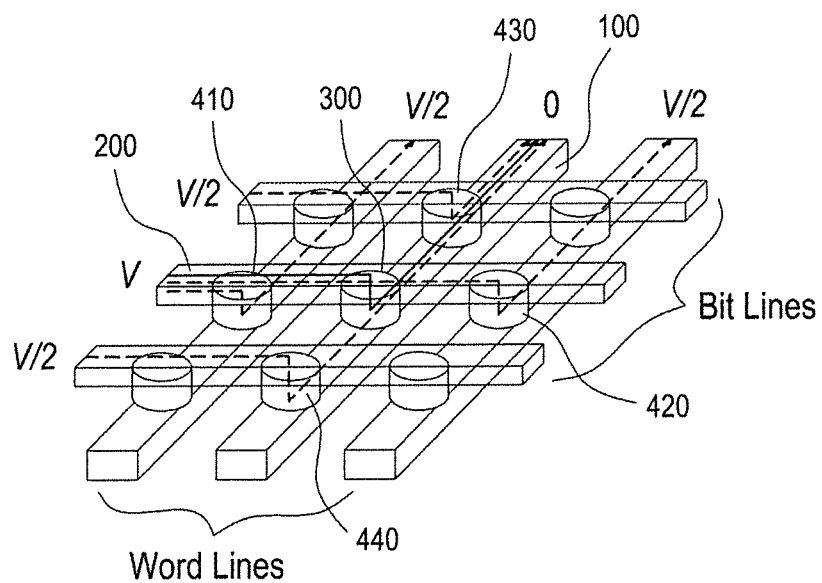
FIG. 4 is an operation diagram of a cross-type array. During the reading operation by a V/2 method, leakage currents of adjacent unselected cells are sensed together.
Figure 5:
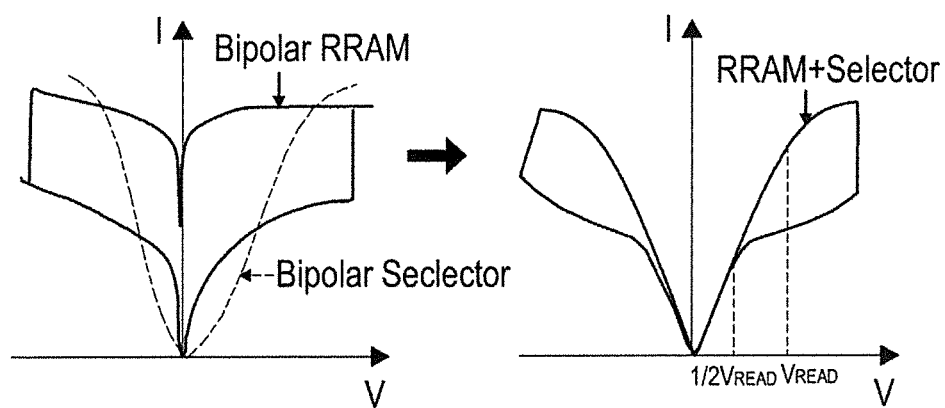
FIG. 5 is an electrical characteristic diagram showing the operation by a V/2 method of the conventional bipolar RRAM by connecting a bipolar selector.
Figure 6:
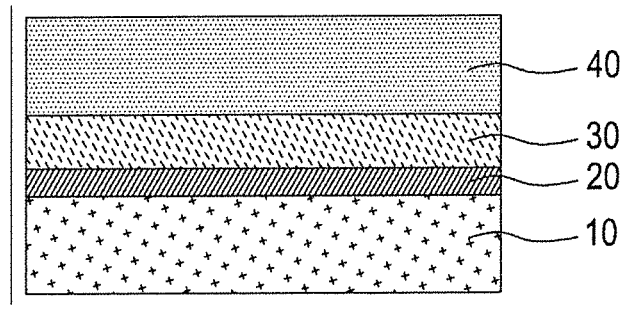
FIG. 6 is a cross sectional view showing a structure of a resistive random access memory device according to an embodiment of the present invention.
Figure 7:
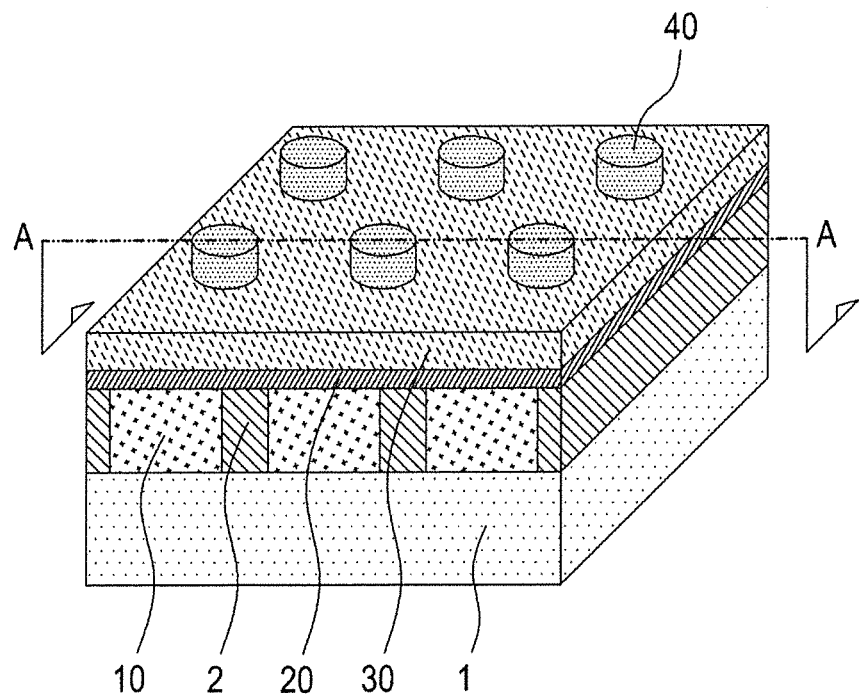
FIG. 7 is a perspective view showing a structure of a memory array using a resistive random access memory device according to an embodiment of the present invention.
Figure 8:
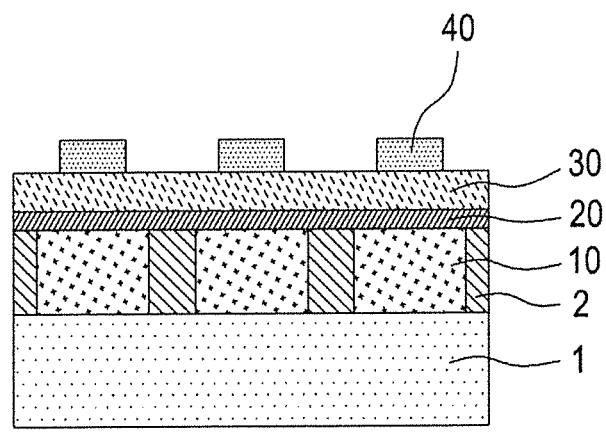
FIG. 8 is a cross sectional view of line AA in FIG. 7.

First, referring to FIGS. 6 to 8, a resistive random access memory device according to an embodiment of the present invention is described.

A resistive random access memory device according to an embodiment of the present invention, as exemplarily shown in FIGS. 6 to 8, comprises: a bottom electrode 10 formed of a semiconductor material implanted with impurity ions; a tunneling insulator layer 20 formed on the bottom electrode; a resistance change layer 30 formed on the tunneling insulator layer; and a top electrode 40 formed on the resistance change layer.

Here, the semiconductor material can be any materials that have conductivity to be obtained by an impurity ion doping. So semiconductor materials to form circuit devices except memory devices can be also used. But it is preferable that the semiconductor material is silicon for process compatibility and economical reason. Silicon bottom electrodes can be formed of conductive lines of single- or poly-crystal or amorphous silicon implanted with impurity ions at a high concentration when a resistive random access memory device according to the present invention is vertically stacked on a semiconductor substrate.

As an example, if the semiconductor material (e.g., a silicon substrate) is an n-type, the bottom electrode 10 can be formed of a p-type conductive line implanted with a p-type impurity ion (e.g., $BF_2^+$) at a high concentration (e.g., a dose of $1\times10^{15}/cm^2$). Of cause, the opposite can be also formed.

Figure 9A:
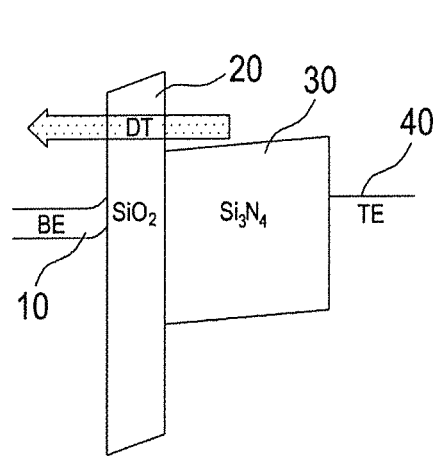
FIGS. 9(A) and 9(B) are diagrams showing two tunneling mechanisms of a resistive random access memory device according to an embodiment of the present invention.
Figure 9B:
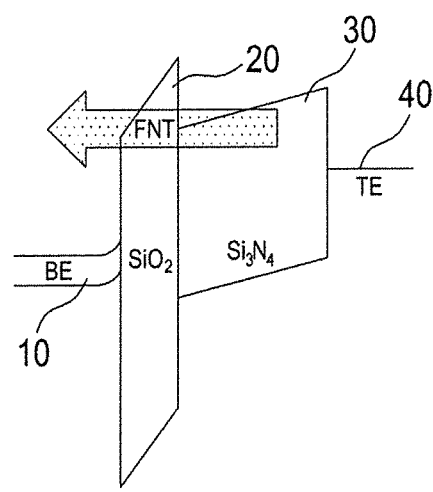

As shown in FIGS. 9 and 10, current can flow through the tunneling insulator layer 20 by two tunneling mechanisms depending on the applied voltages.

For an example, when a low voltage ($V_{READ}/2$) is applied between top 40 and bottom 10 of an unselected cell, a direct tunneling (DT) can be generated. But, because the probability of the DT generation is very low, the tunneling insulator layer 20 can act as a barrier of the current.

On the other hand, when a high voltage ($V_{READ}$) is applied between top 40 and bottom 10 of a selected cell, a Fowler-Nordheim (F-N) tunneling can be generated. By the result, the tunneling barrier is modified as a triangular barrier by the high electric field. Thus, the tunneling insulator layer 20 may permit a higher current to flow due to the reduction of a valid tunneling barrier thickness and the exponential increase of tunneling current.

Therefore, by embedding the tunneling insulator layer 20 between a resistance change layer 30 and a bottom electrode 10, the unselected cell permits a low current ($I_1$) by direct tunneling (DT) in the low voltage ($V_{READ}/2$) regime and the selected cell permits a high current ($I_2$) by Fowler-Nordheim (F-N) tunneling in the high voltage ($V_{READ}$) regime. As a result, memory device can effectively suppress the leakage current in a read operation by raising the selection ratio ($I_2/I_1$).

In order to effectively raise the selection ratio ($I_2/I_1$) of the above mentioned memory device, the material and thickness of the tunneling insulator layer 20 must be optimized.

First, regarding the material of the tunneling insulator layer 20, if the bottom electrode 10 is formed of doped silicon, silicon oxide ($SiO_2$) film can be used to form it easily. Preferably, the tunneling insulator layer 20 is formed of a low dielectric (low-k) material having lower dielectric constant than the silicon oxide film and the resistance change layer 30 is formed of a high dielectric (high-k) material having higher dielectric constant than the silicon oxide film. The reason is that, by forming the tunneling insulator layer 20 with a low dielectric (low-k) material, the more raising the electric field in the tunneling insulator layer 20, the more reducing the valid tunneling barrier thickness and the more raising the current ($I_2$) by F-N tunneling. And it is possible to obtain a high selection ratio ($I_2/I_1$).

The low dielectric (low-k) materials used to form the tunneling insulator layer 20 may be carbon-doped silicon dioxide, porous silicon dioxide, HSQ, etc., but not limited to.

On the other hand, if the excessive electric field applies to the tunneling insulator layer 20, it can cause an insulator breakdown and deterioration of repeated read/write capability (endurance). Accordingly, it can be difficult to keep the low power operation and high selection ratio. Thus, the optimization of the thickness of the tunneling insulator layer must be simultaneously considered.

If the thickness of the tunneling insulator layer 20 is excessively narrow as less than 2 nm, the current ($I_1$) by a direct tunneling (DT) in the low voltage ($V_{READ}/2$) regime is raised. Thus, in this case, it is difficult to maximize the difference between the current ($I_1$) by direct tunneling (DT) and the current ($I_2$) by an F-N tunneling in the high voltage ($V_{READ}$) regime.

On the other hand, if the thickness of the tunneling insulator layer 20 is excessively thick as more than 3 nm, it is difficult to generate F-N tunneling. Thus, in order to obtain the high selection ratio, it needs a higher applying voltage. But the higher voltage can cause a generation of current overshoot. Due to these facts, it can not be difficult to make a low power operation.

Therefore, the thickness of the tunneling insulator layer 20 may preferably be 2~3 nm.

Figure 11:
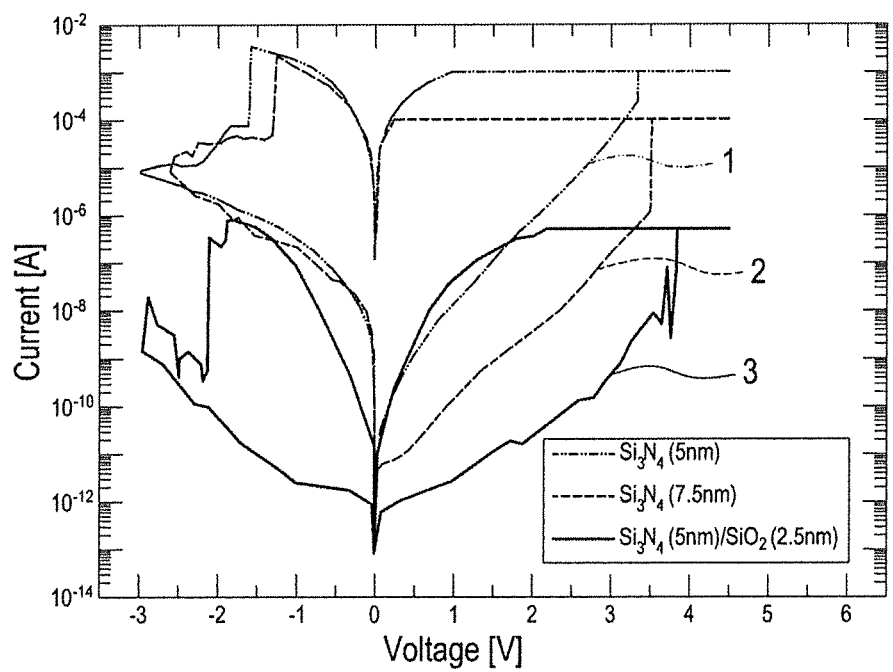
FIG. 11 is a current-voltage characteristic diagram showing comparison of electrical characteristics of three devices having a single resistance change layer of different silicon nitride ($Si_3N_4$) thicknesses (i.e., curves 1 and 2) and double layers consisting of a resistance change layer of silicon nitride ($Si_3N_4$) and a tunneling insulator layer of silicon oxide (i.e., curve 3).

And, as known in FIG. 11, if the thickness of the tunneling insulator layer 20 is suitably controlled within the range of 2~3 nm, the operation current can be lowered to μA level less than that in a device having the resistance change layer 30 only without the tunneling insulator layer 20. Thus, the low power operation can be possible.

FIG. 11 is a current-voltage characteristic diagram showing comparison of electrical characteristics of three devices having a single resistance change layer of different silicon nitride ($Si_3N_4$) thicknesses (i.e., curves 1 and 2) and double layers consisting of a resistance change layer of silicon nitride ($Si_3N_4$) and a tunneling insulator layer of silicon oxide (i.e., curve 3).

The resistance change layer 30 performs memory function of a cell because it has a low resistance state (LRS) or a high resistance state (HRS) determined by whether conducting paths are formed or not therein. Though conducting paths can be formed by other means, it is preferably that the conducting paths are formed with traps in the resistance change layer 30 because it does not need additional forming processes. Namely, when a high set voltage is applied between top 40 and bottom 10 electrodes, a high electric field is formed in the resistance change layer 30 in a top electrode direction and electrons accelerated by heating destroy covalent bonds of the resistance change layer material and make dangling bonds. The dangling bonds form many traps in the top electrode direction and the traps form conducting paths. Thus, a low resistance state (LRS)

appears. When a negative voltage as a reset voltage is applied, the amount of traps is reduced and the conducting paths are cut off. The resistance change layer 30 has a high resistance state (HRS) again.

Therefore, the resistance change layer 30 is preferably formed of material having traps or particularly one or more of nitride, $Pr_{1-x}Ca_xMnO_3(0 \leq x \leq 1)$, $SrTiO_3$, amorphous silicon and carbon.

Here, the nitride may be $Si_3N_4$ or a material such as $SiN_x$, $AlN_x$, $ZrN_x$, $NiN_x$, $WN_x$, or $HfN_x$, etc.

The top electrode 40 can be formed of material, such as W, Ni, Ti, or TiN, widely used in the conventional CMOS process due to the easy etching.

FIG. 9 is an embodiment of the present invention showing operations by two tunneling mechanisms depending on the applied voltages in a resistive random access memory device that comprises the bottom electrode (BE) formed of a silicon substrate (p+Si) doped with a high concentration of p-type impurity ions, the tunneling insulator layer 20 formed of a silicon oxide ($SiO_2$) film, the resistance change layer 30 formed of a silicon nitride ($Si_3N_4$) film and the top electrode (TE) 40 formed of Ni.

Figure 10A:
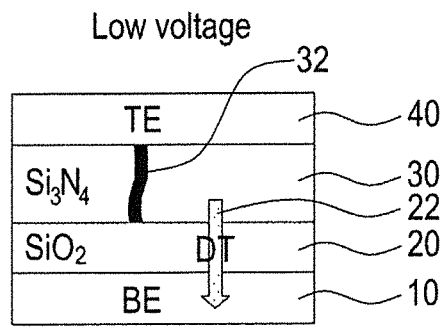
FIGS. 10(A) and 10(B) are concept diagrams of an embodiment operated by two tunneling mechanisms of FIGS. 9(A) and 9(B), respectively.
Figure 10B:
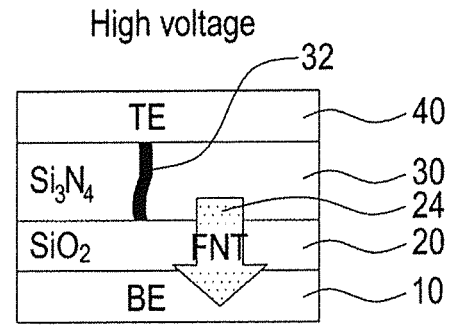

FIG. 10 shows different current flows depending on the applied voltages though the low resistance state (LRS) appears by forming the conducting path 32 in the tunneling insulator layer 20 of the embodiment of FIG. 9. When a low voltage ($V_{READ}/2$) is applied to an unselected cell as shown in FIG. 10(A), a low leakage current generated by a direct tunneling (DT) flows. When a high voltage ($V_{READ}$) is applied to a selected cell as shown in FIG. 10(B), a high operation current generated by an F-N tunneling flows.

FIG. 11 is a current-voltage characteristic diagram showing comparison of electrical characteristics of three devices having a single resistance change layer of different silicon nitride ($Si_3N_4$) thicknesses (i.e., curves 1 and 2) and double layers consisting of a resistance change layer 30 of silicon nitride ($Si_3N_4$) and a tunneling insulator layer 20 of silicon oxide (i.e., curve 3) having 5 nm and 2.5 nm thickness, respectively. As mentioned above, by referring to FIG. 11, it is known that if the thickness of the tunneling insulator layer 20 is suitably adjusted, the operation current can be lowered to μA level less than that in a device having the resistance change layer 30 only without the tunneling insulator layer 20. Thus, the low power operation can be possible.

Figure 12A:
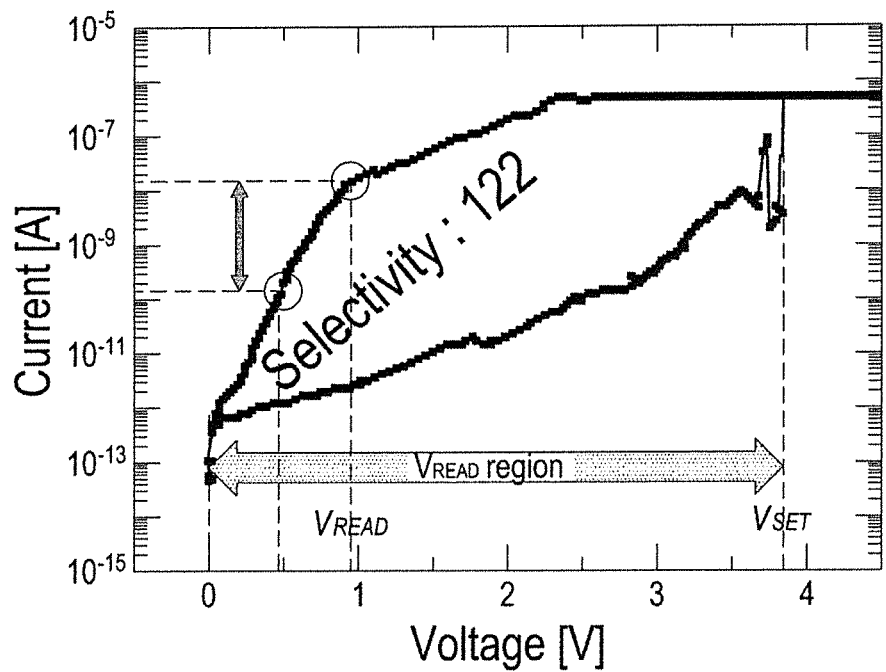
FIGS. 12(A) and 12(B) are partially enlarged diagrams of curve 3 according to an embodiment of the present invention in FIG. 11.
Figure 12B:
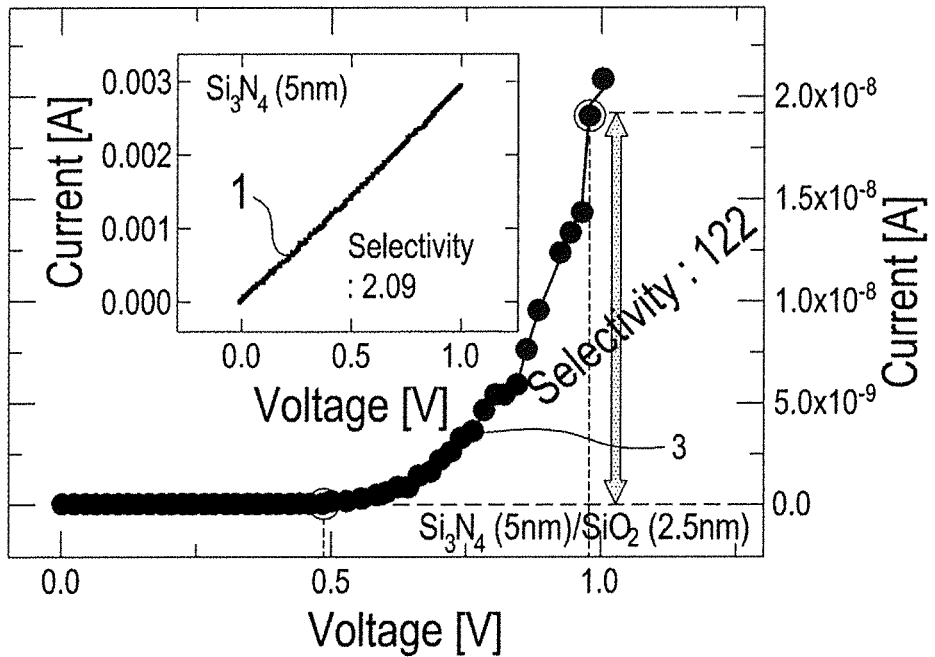

FIGS. 12(A) and 12(B) are partially enlarged diagrams of curve 3 according to an embodiment of the present invention in FIG. 11. FIG. 12(A) is a log scale and FIG. 12(B) is a linear scale showing curve 3 according to an embodiment of the present invention together with curve 1 of a single layer. According to FIG. 12(B), the selection ratio of curve 3 of an embodiment of the present invention is 60 times or more than that of curve 1 formed of silicon nitride ($Si_3N_4$) film as a single layer of 5 nm thickness.

Next, detailed descriptions of a memory array according to an embodiment of the present invention are provided.

A memory array according to an embodiment of the present invention is using the above mentioned resistive random access memory device of the present invention as a unit cell device and, as shown in FIGS. 7 and 8, comprises: a semiconductor substrate 1; a plurality of word lines 10 formed in the semiconductor substrate 10 in a first direction (e.g., a vertical direction to a line AA in FIG. 7), a separating insulator film 2 being located between the word lines 10; a tunneling insulator layer 20 formed on the plurality of word lines; a resistance change layer 30 formed on the tunneling insulator layer 20; and a plurality of bit lines (not shown) formed on the resistance change layer 30 in a second direction (e.g., a direction of a line AA in FIG. 7) across the word lines 10.

Here, the word lines 10 can be used as bottom electrodes of unit cell devices and the bit lines (not shown) can be used as top electrodes.

And, as shown in FIG. 7, in places where the word lines 10 are across the bit lines (not shown), namely, at the acrossing points where the unit cell devices are formed on, metal contact plugs 40 can be further formed between the resistance changer layer 30 and the bit lines (not shown) and the metal contact plugs can be used as top electrodes of the unit cell devices.

FIG. 7 is a perspective view showing a structure of a memory array using a resistive random access memory device according to an embodiment of the present invention and FIG. 8 is a cross sectional view of line AA in FIG. 7.

If the semiconductor substrate 1 (e.g., a silicon substrate) is an n-type, the bottom electrode 10 can be formed of a p-type conductive line implanted with a p-type impurity ion (e.g., $BF_2^+$) at a high concentration (e.g., a dose of $1 \times 10^{15}/cm^2$). Of cause, the opposite can be also formed.

The separating insulator film 2 can be an oxide film such as STI or a silicon oxide film.

The detailed descriptions of the tunneling insulator layer 20 and the resistance change layer 30 are the same as the above descriptions on the embodiment of the cell device.

Next, detailed descriptions of a fabrication method of a memory array according to an embodiment of the present invention are provided with reference to FIGS. 7 and 8.

A fabrication method of a memory array according to an embodiment of the present invention is to fabricate the above mentioned memory array of the present invention.

First, a plurality of word lines 10 are formed in a semiconductor substrate 1 by forming separating insulator films 2 and having an ion implantation (a first step).

Here, the semiconductor substrate 1 can be a silicon substrate and, the first step can further include steps of: forming a buffer layer (not shown) with silicon oxide film having about 60 Å thickness before forming the separating insulator films 2 and having the ion implantation, and removing the buffer layer after forming the separating insulator films 2 and having the ion implantation. At this time, the silicon substrate is an n-type substrate. After the silicon substrate is implanted with impurity ions of $BF_2^+$ in a dose of $1 \times 10^{15}/cm^2$ by energy of 40 keV, the buffer layer can be removed by diluted HF solution.

Though the separating insulator film 2 can be formed by the well-known STI process, after the ion implantation, it is preferably formed by a high temperature oxidation and annealing process of 1050° C. after exposing the silicon substrate by partially removing the buffer layer at the separating insulator film candidate region. By the latter process, the lattice damages induced by the ion implantation can be simultaneously cured and the process step can be reduced.

Next, a tunneling insulator layer 20 is formed on the plurality of word lines 10 by a deposition or oxidation process (a second step).

Here, the tunneling insulator layer 20 can be formed on the word lines 10 only with a thin layer by heat oxidation process, but can be also formed on the word lines 10 and the separating insulator film 2 with a layer of a predetermined thickness by deposition process. In the two processes, the thickness of the tunneling insulator layer 20 can be adjusted by process variables. Thus, as the mentioned above, the suitable thickness can raise the selection ratio of a cell and lower the operation current to μA level or less. As a result, it can be possible to make a low power operation.

Particularly, the tunneling insulator layer 20 in the second step can be formed of a silicon oxide film by a low temperature oxidation process at 783° C.

Then, a resistance change layer 30 is formed by a chemical vapor deposition (CVD) on the tunneling insulator layer 20 (a third step).

Next, a plurality of bit lines (not shown) is formed on the resistance change layer 30 in a direction across the word lines (a fourth step).

As shown in FIG. 7, when metal contact plugs 40 are used as the top electrodes of each cell, before forming the bit lines (not shown), the metal contact plug forming process can be further performed.

The detailed descriptions of composite materials are the same as the above descriptions of embodiments of the cell device.

As the above mentioned, the word lines 10 can be formed in the semiconductor substrate 1 by implanting impurity ions to have an opposite conductive type to that of the semiconductor substrate 1. Thus, it has an advantage that simultaneously fabricates together with the circuit devices by the silicon compatibility.

This work was supported by the National Research Foundation of Korea (NRF) grant funded by the Korea government (MSIP) (2015R1A2A1A01007307).

What is claimed is:

1. A resistive random access memory device comprising:
   a bottom electrode formed of a semiconductor material implanted with impurity ions;
   a tunneling insulator layer formed on the bottom electrode;
   a resistance change layer formed on the tunneling insulator layer; and
   a top electrode formed on the resistance change layer.

2. The resistive random access memory device of claim 1, wherein the resistance change layer is formed of a high dielectric (high-k) material having a higher dielectric constant than silicon oxide ($SiO_2$) film, and
   wherein the tunneling insulator layer is formed of a silicon oxide film or a low dielectric (low-k) material having a lower dielectric constant than the silicon oxide film and has a thin thickness less than that of the resistance change layer.

3. The resistive random access memory device of claim 1, wherein the semiconductor material is silicon and the resistance change layer is formed of material having traps.

4. The resistive random access memory device of claim 3, wherein the bottom electrode is implanted with p-type impurity ions,
   wherein the tunneling insulator layer is formed of one of $SiO_2$, carbon-doped silicon dioxide, porous silicon dioxide and HSQ, and
   wherein the resistance change layer is formed of one or more of nitride, $Pr_{1-x}Ca_xMnO_3 (0 \leq x \leq 1)$, $SrTiO_3$, amorphous silicon and carbon.

5. The resistive random access memory device of claim 4, wherein the nitride is $Si_3N_4$ and the tunneling insulator layer has a thickness of 2~3 nm.

6. The resistive random access memory device of claim 2, wherein the semiconductor material is silicon and the resistance change layer is formed of material having traps.

7. The resistive random access memory device of claim 6, wherein the bottom electrode is implanted with p-type impurity ions,
   wherein the tunneling insulator layer is formed of one of $SiO_2$, carbon-doped silicon dioxide, porous silicon dioxide and HSQ, and
   wherein the resistance change layer is formed of one or more of nitride, $Pr_{1-x}Ca_xMnO_3 (0 \leq x \leq 1)$, $SrTiO_3$, amorphous silicon and carbon.

8. The resistive random access memory device of claim 7, wherein the nitride is $Si_3N_4$ and the tunneling insulator layer has a thickness of 2~3 nm.

9. A memory array using the resistive random access memory device of claim 1 as a unit cell device, comprising:
   a semiconductor substrate;
   a plurality of the bottom electrodes forming word lines in the semiconductor substrate in a first direction, a separating insulator film being located between the word lines;
   the tunneling insulator layer formed on the plurality of word lines;
   the resistance change layer formed on the tunneling insulator layer; and
   a plurality of the top electrodes forming bit lines on the resistance change layer in a second direction across the word lines.

10. The memory array of claim 9,
    wherein metal contact plugs are further formed between the resistance changer layer and the bit lines at places where the word lines are across the bit lines.

11. The memory array of claim 9,
    wherein the resistance change layer is formed of a high dielectric (high-k) material having a higher dielectric constant than silicon oxide ($SiO_2$) film, and
    wherein the tunneling insulator layer is formed of a silicon oxide film or a low dielectric (low-k) material having a lower dielectric constant than the silicon oxide film and has a thin thickness less than that of the resistance change layer.

12. The memory array of claim 11,
    wherein the word lines are implanted with p-type impurity ions,
    wherein the tunneling insulator layer is formed of one of $SiO_2$, carbon-doped silicon dioxide, porous silicon dioxide and HSQ, and
    wherein the resistance change layer is formed of one or more of nitride, $Pr_{1-x}Ca_xMnO_3 (0 \leq x \leq 1)$, $SrTiO_3$, amorphous silicon and carbon.

13. The memory array of claim 12,
    wherein the nitride is $Si_3N_4$ and the tunneling insulator layer has a thickness of 2~3 nm.

14. The memory array of claim 10,
    wherein the resistance change layer is formed of a high dielectric (high-k) material having a higher dielectric constant than silicon oxide ($SiO_2$) film, and
    wherein the tunneling insulator layer is formed of a silicon oxide film or a low dielectric (low-k) material having a lower dielectric constant than the silicon oxide film and has a thin thickness less than that of the resistance change layer.

15. The memory array of claim 14,
    wherein the word lines are implanted with p-type impurity ions,
    wherein the tunneling insulator layer is formed of one of $SiO_2$, carbon-doped silicon dioxide, porous silicon dioxide and HSQ, and
    wherein the resistance change layer is formed of one or more of nitride, $Pr_{1-x}Ca_xMnO_3 (0 \leq x \leq 1)$, $SrTiO_3$, amorphous silicon and carbon.

16. The memory array of claim 15,
wherein the nitride is $Si_3N_4$ and the tunneling insulator layer has a thickness of 2~3 nm.

17. A method for fabricating the memory array of claim 9, comprising:
- a first step of forming the plurality of word lines in the semiconductor substrate by forming the separating insulator films and having an ion implantation;
- a second step of forming the tunneling insulator layer on the plurality of word lines by a deposition or oxidation process;
- a third step of forming the resistance change layer by a chemical vapor deposition (CVD) process; and
- a fourth step of forming the plurality of bit lines on the resistance change layer in the direction across the word lines.

18. The method of claim 17,
wherein the semiconductor substrate is a silicon substrate, and
wherein the first step further includes steps of forming and removing a buffer layer formed of silicon oxide film before and after forming the separating insulator films and having the ion implantation, respectively.

19. The method of claim 18,
wherein, after having the ion implantation, the separating insulator film is formed by high temperature oxidation and annealing process after exposing the silicon substrate by partially removing the buffer layer at a region to form the separating insulator film.

20. The method of claim 18,
wherein the tunneling insulator layer of the second step is formed of silicon oxide film by a low temperature oxidation process, and
wherein the resistance change layer of the third step is continuously formed of silicon nitride ($Si_3N_4$) film by low pressure chemical vapor deposition (LPCVD) after forming the tunneling insulator layer.

* * * * *